United States Patent
Pillay et al.

(10) Patent No.: US 6,847,244 B2
(45) Date of Patent: Jan. 25, 2005

(54) VARIABLE DUTY CYCLE CLOCK GENERATION CIRCUITS AND METHODS AND SYSTEMS USING THE SAME

(75) Inventors: Sanjay Pillay, Austin, TX (US); Khoi Mai, Austin, TX (US); Luo Zheng, Austin, TX (US); Dimitri Pantelakis, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/200,824

(22) Filed: Jul. 22, 2002

(65) Prior Publication Data

US 2004/0135608 A1 Jul. 15, 2004

(51) Int. Cl.$^7$ ................................................ H03K 5/04
(52) U.S. Cl. ........................ 327/174; 327/114; 327/172
(58) Field of Search ................................ 327/113, 175, 327/114, 263, 264, 172, 174, 176

(56) References Cited

U.S. PATENT DOCUMENTS

| | | | | |
|---|---|---|---|---|
| 5,907,254 A | * | 5/1999 | Chang | 327/165 |
| 6,198,322 B1 | * | 3/2001 | Yoshimura | 327/175 |
| 6,320,438 B1 | | 11/2001 | Arcus | 327/175 |
| 6,374,361 B1 | * | 4/2002 | Lee et al. | 713/503 |
| 6,501,307 B1 | * | 12/2002 | Yen | 327/113 |

* cited by examiner

*Primary Examiner*—Tuan T. Lam
*Assistant Examiner*—Hiep Nguyen
(74) *Attorney, Agent, or Firm*—Thompson & Knight LLP; James J. Murphy

(57) ABSTRACT

A signal generator generates an output signal with a programmable duty cycle and includes a first buffer which generates in response to an input signal an intermediate signal having a selected edge with a voltage slope selected to vary a length of a selected phase of the output signal. A second buffer having a selected input voltage threshold generates the output signal in response to the intermediate signal.

10 Claims, 7 Drawing Sheets

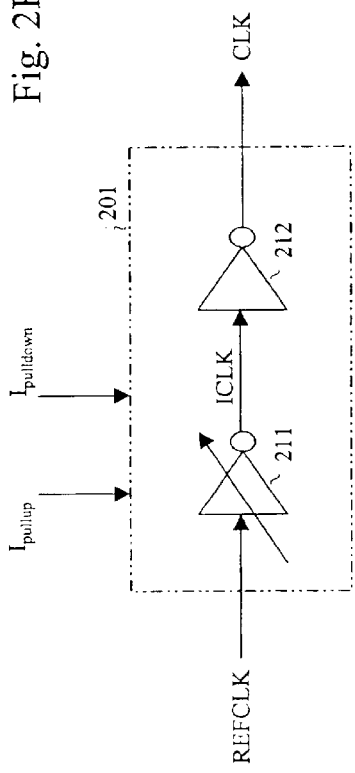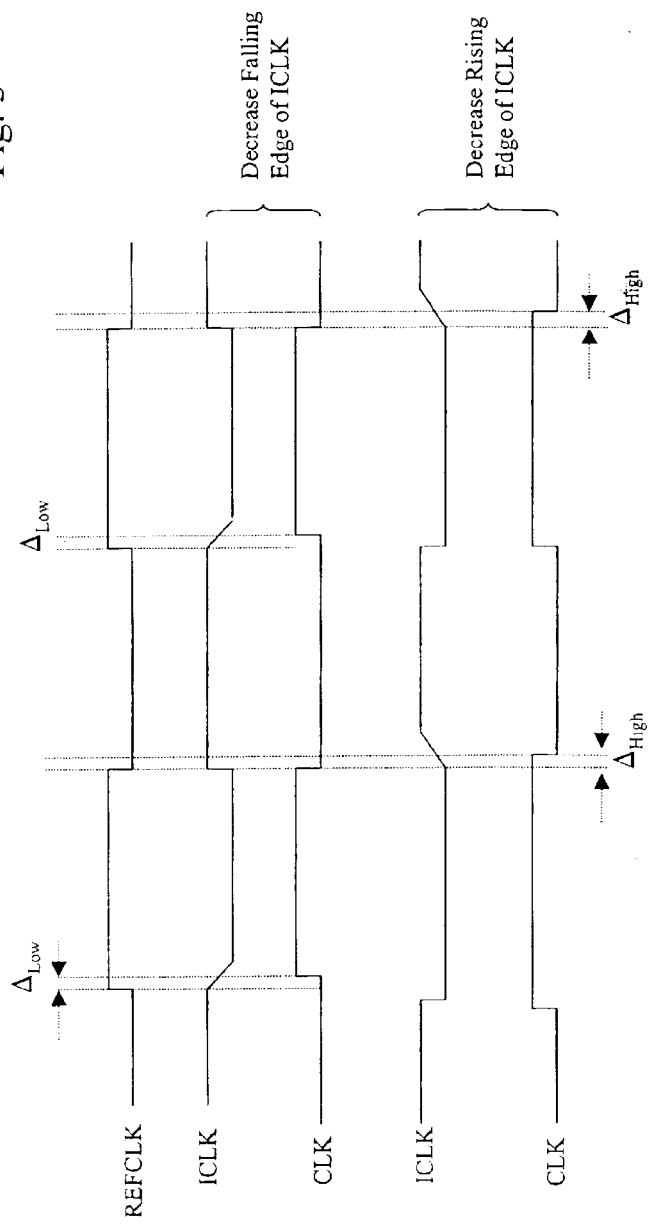

VARIABLE DUTY CYCLE CLOCK GENERATION CIRCUITS AND METHODS AND SYSTEMS USING THE SAME

BACKGROUND OF THE INVENTION

1. Field of Invention

The present invention relates in general to digital signal processing and in particular, to variable duty cycle clock generation circuits and methods and systems using the same.

2. Background of Invention

In digital signal processing (DSP) architectures, processing operations are typically triggered on either an active rising edge or an active falling edge of a clock or similar timing signal. In some DSP architectures, the execution of the majority of the processing operations is restricted to the active clock phase of the clock period between the each active edge and the following inactive edge. Fewer operations are then performed during the inactive clock phase between the inactive edge and the next active edge. In these DSP architectures, an asymmetric duty cycle clock with an extended active clock phase and a decreased inactive clock phase can improve timing margins and increase overall system speed. For example, in an architecture in which operations are triggered on active falling clock edges, the active low clock phase between each active falling clock edge and the next inactive rising edge is extended, for instance to fifty-five percent (%55) of the total clock period. Consequently, the following inactive high phase between the inactive rising clock edge and the next active clock edge is shortened by an equal amount, in this example to forty-five percent (%45) of the total clock period. In other words, the asymmetric duty cycle for the clock signal, in this example, is %55 to %45 in favor of the active low clock phase.

In other DSP architectures, maintaining a symmetric clock (i.e. having a %50 to %50 high phase to low phase duty cycle) is critical. However, maintaining a precise symmetric clock signal can be a difficult task, especially if the clock signal is generated directly from an external crystal with a nonzero output signal duty cycle error tolerance. Guardbands can be designed into the circuit timing margins to account for clock signal duty cycle variations caused by tolerances in the external crystal, but implementing guardbands sacrifices circuit speed and chip area. Alternatively, symmetric clock signals can be generated using a phase-locked loop (PLL) driven by a voltage controlled oscillator (VCO) running at twice the required frequency. The VCO output is then divided by two (2) to generate the desired base clock frequency. However, this PLL technique also sacrifices the accuracy of the ultimate clock signal duty cycle and adds circuitry to the design, particularly when high speed clocks are being generated.

In sum, new circuits and methods are required for generating accurate timing signals, such as high speed clocks. These circuits and methods should allow for the generation of precise active edges in either symmetric and asymmetric timing signals. Furthermore, the duty cycle of these timing signals should be variable under user control, as required to optimize circuit and system performance.

SUMMARY OF INVENTION

According to the inventive concepts. Circuits and methods are disclosed for generating clock and similar timing signals with variable duty cycles. According to one representative embodiment, a signal generator is disclosed with generates an output signal with a programmable duty cycle and includes a first buffer which generates in response to an input signal an intermediate signal having a selected edge with a voltage slope selected to vary a length of a selected phase of the output signal. A second buffer having a selected input voltage threshold generates the output signal in response to the intermediate signal.

The inventive concepts allow for the selective generation of both symmetric and asymmetric timing signals with programmable rising and falling edges. By moving in time the rising edges of the timing signal, the length of the logic high phases is extendable by a corresponding time interval. Similarly, by moving in time the falling edges of the timing signal, the length of the logic low phases is extended by a corresponding time interval. A feedback loop allows for the desired duty cycle value to be set in response to a digital control word and maintained at the desired value during system operation.

BRIEF DESCRIPTION OF DRAWINGS

For a more complete understanding of the present invention, and the advantages thereof, reference is now made to the following descriptions taken in conjunction with the accompanying drawings, in which:

FIG. 2B depicts a conceptual block diagram of an exemplary variable current buffer suitable for use in the clock generator of FIG. 2A;

FIG. 3 is a conceptual timing diagram of exemplary operations of variable current buffer of FIG. 2B;

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
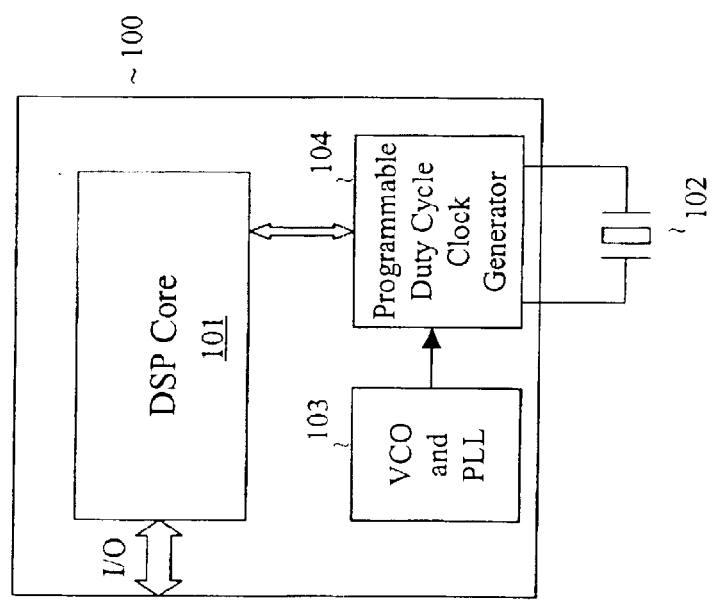
FIG. 1 is a high level functional block diagram of a representative system-on-a-chip (SOC) suitable for describing the application of the present inventive principles.

FIG. 1 is a high level functional block diagram of a representative system-on-a-chip (SOC) 100 suitable for describing the application of the present inventive principles. Exemplary SOC 100 includes a digital signal processing (DSP) core 101 operating in response to one or more clock signals. Each clock signal has either symmetric or asymmetric active and inactive phases and either active rising edges or active falling edges. While a DSP core 101 is shown in FIG. 1 for illustrative purposes, the clocked circuitry of SOC 100 in alternate embodiments may include a microprocessor, microcontroller, or one or more blocks of random logic.

SOC 100 operates in one embodiment in response to a reference clock signal CLKREF of a given reference frequency generated from an external crystal 102. The reference clock signal CLKREF is alternatively generated by an on-chip voltage controlled oscillator (VCO) and phase-locked loop (PLL) shown collectively as block 103 in FIG. 1.

Reference clock CLKREF is provided to a programmable duty cycle clock generator 104, which will be discussed in detail below. Generally, programmable duty cycle clock generator 104 includes a register programmable variable current driver driven by reference clock CLKREF. Variation of the current utilized by the variable current driver to pull-up and pull-down its outputs varies the voltage rise time of rising edges and/or the voltage fall time of falling edges of a resulting intermediate clock signal ICLK. In turn, variation of the edge slope (voltage rise or fall time) of intermediate clock signal ICLK varies in time the trigger point at which the input trigger (threshold) voltage of a following clock driver stage is reached. The variation in time of the trigger point results in a proportional variation in the generation time of the corresponding clock edge by the clock driver stage and the length of the following clock phase. For example, if the slope of the intermediate signal is reduced, the clock driver will trigger later in time thereby delaying generation of the corresponding clock edge and shortening the following clock phase.

Figure 2A:
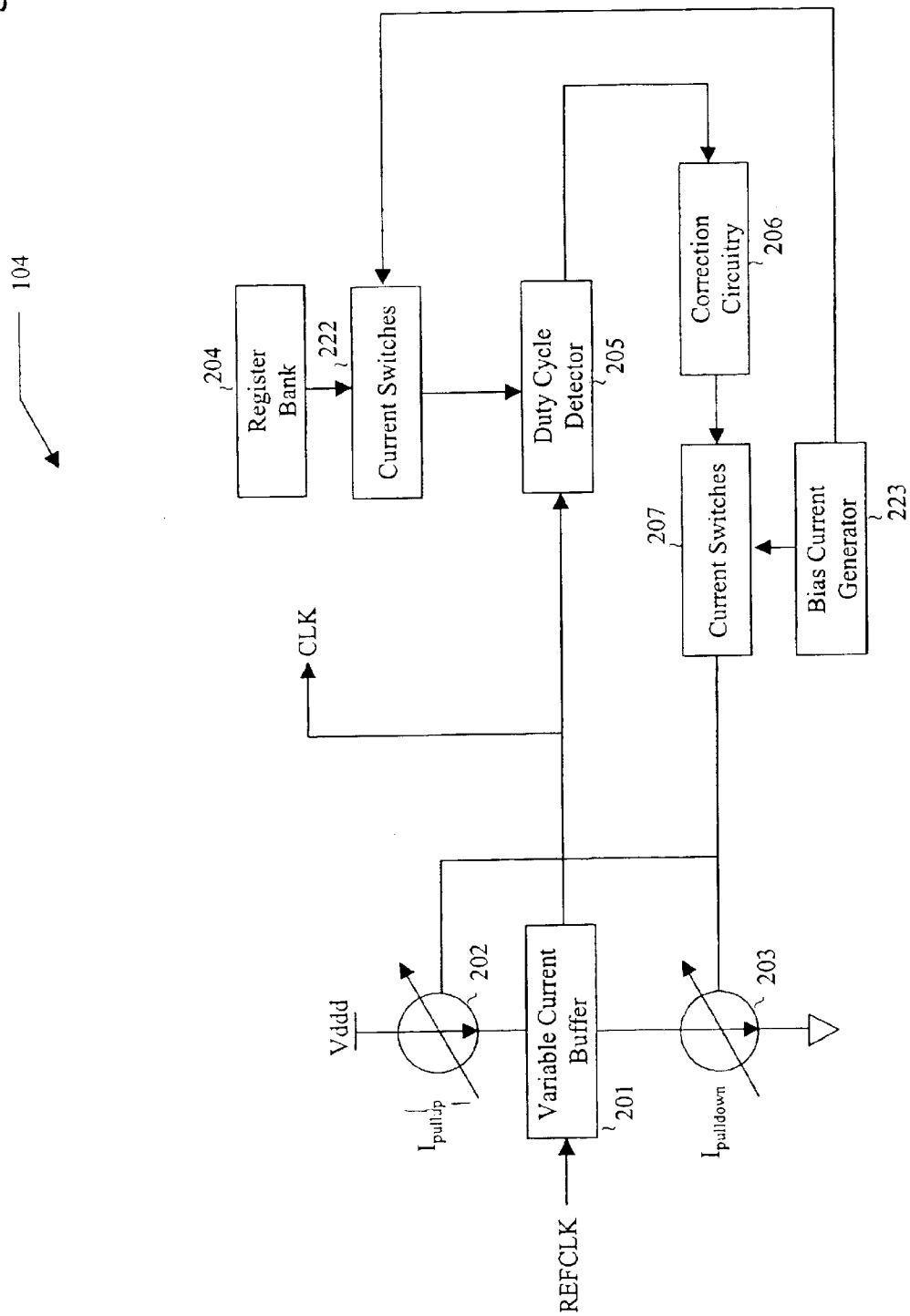
FIG. 2A is a high-level functional block diagram of an exemplary embodiment of a programmable duty cycle clock generator embodying the inventive principles.

FIG. 2A is a high-level functional block diagram of an exemplary embodiment of programmable duty cycle clock generator 104. A variable current buffer 201 generates an output signal CLK from the reference clock REFCLK. A conceptual block diagram of variable current buffer 201 is provided in FIG. 2B. Variable current buffer 104 is represented in FIG. 2B by a variable current inverter 211 which receives the reference clock REFCLK and generates the intermediate clock signal ICLK with rising and falling edges of the desired slope.

The slope (rise time) of the rising edges of intermediate clock signal ICLK is varied by varying the pull-up current $I_{Pullup}$ with the variable pull-up current source 202 of FIG. 2A. An increase in $I_{Pullup}$ will decrease (shorten) the rise time to its maximum value and a decrease in $I_{Pullup}$ will increase (lengthen) the rise time. The slope of the falling edges of intermediate clock signal ICLK is varied by varying the pull-down current $I_{Pulldown}$ with the variable pull down current sink 203 of FIG. 2A. An increase in $I_{Pulldown}$ will decrease (shorten) the fall time to its maximum value and a decrease in $I_{Pulldown}$ will increase (lengthen) the fall time.

The intermediate clock ICLK drives clock driver 212 of FIG. 2B, which in this example is an inverter. Inverter 212 has a given input threshold voltage across which the output signal CLK transitions state. Inverter 212 also improves (sharpens) the edges of clock signal CLK. For purposes of discussion, the input threshold voltage for inverter is nominally shown as being at approximately the fifty percent (50%) voltage point of the rising and falling edges of ICLK, although the exact threshold voltage may vary depending on the design of inverter 302. Inverter 212 generates clock signal CLK with the high-speed rising and falling edges required for operation of the clocked circuitry of SOC 100.

FIG. 3 is a conceptual timing diagram of exemplary operations of variable current buffer 201. In this example, reference clock signal REFCLK is a symmetric clock signal, although reference clock signal REFCLK can be an asymmetrical signal in alternate embodiments. In the following discussion, an active low clock phase of a clock signal, such as REFCLK, CLK, or ICLK refers to that logic low voltage phase of each clock period between an falling (active) edge and the next rising (inactive) edge. Similarly, an active high clock phase refers to that logic high voltage phase of each clock period between an rising (active) edge and the next falling (inactive) edge.

For an active low embodiment of clock signal CLK, the active low phase of each clock period is increased by lengthening the fall time of the falling edges of intermediate clock ICLK, as shown in the upper three traces of FIG. 3. Lengthening the fall times of intermediate clock signal ICLK delays the generation of the corresponding rising edge of clock signal CLK by a time interval $\Delta_{Low}$. Consequently, by maintaining the rising edges of intermediate clock signal CLK at their current or nominal rise times, the active low phases of clock signal CLK are increased (lengthened) by the time interval $\Delta_{Low}$ and the inactive high phases decreased (shortened) by the time interval $\Delta_{Low}$.

For an active high embodiment of clock signal CLK, the active high phase of each clock period is increased by lengthening the rise time of the rising edges of intermediate clock ICLK, as shown in the lower two traces of FIG. 3. Lengthening the rise time of the rising edges of intermediate clock signal ICLK delays the generation of the corresponding falling edge of clock signal CLK by a time interval $\Delta_{High}$. By maintaining the falling edges of intermediate clock signal CLK at their current or nominal fall times, the active high phases of clock signal CLK are increased by the time interval $\Delta_{High}$ and the inactive low phases decreased by the time interval $\Delta_{High}$.

Returning to FIG. 2A, the duty cycle of CLK is programmed by setting bits in a register bank 204. These bits control a set of weighted current switches 222 and a duty cycle detector 205 which monitors the duty cycle of clock signal CLK and determines whether the duty cycle is above, below or at the expected (programmed value). Depending on the determination made by detector 205, correction circuitry 206 selectively controls the pull-up and pull-down currents ($I_{Pullup}$ and $I_{Pulldown}$) to variable current buffer 201 through a set of binary weighted current switches 207 operating from a unit bias current. Weighted current switches 222 are similar to those discussed below in conjunction with FIG. 5A and switch bias currents generated by bias current generator 223.

Figure 4A:
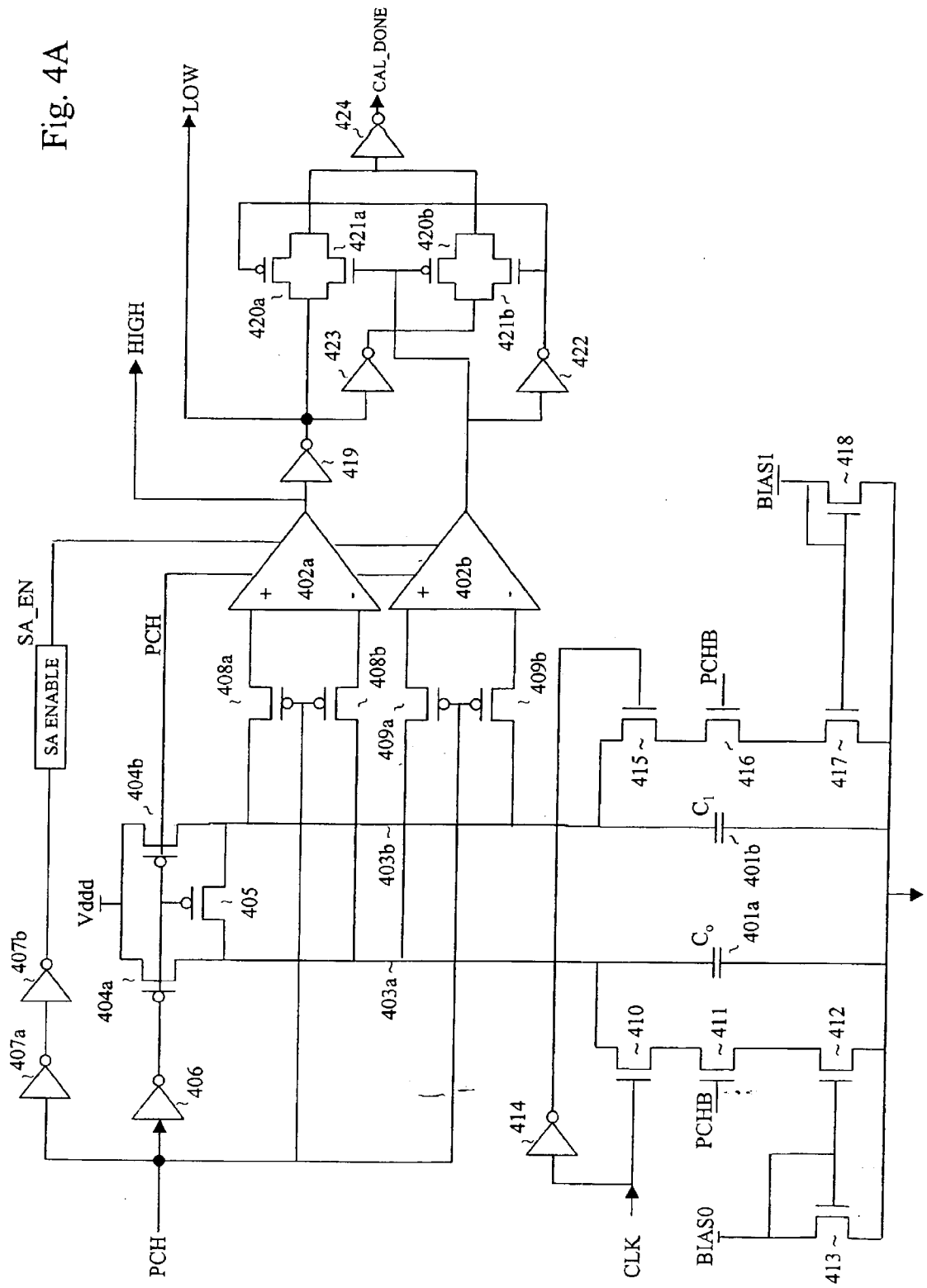
FIG. 4A is an exemplary embodiment of the duty cycle detector of FIG. 4A.

An electrical schematic of an exemplary embodiment of duty cycle detector 204 is shown in FIG. 4.

Duty cycle detector 204 utilizes a pair of capacitors ($C_0$–$C_1$) 401a–401b which charge and then selectively discharge in response to clock signal CLK. The voltage on capacitors 401a–401b are compared against each other by a pair of sense amplifiers 402a and 402b. The results of the two comparisons generate signals HIGH and LOW which indicate that the duty cycle of clock signal CLK is either above or below the expected value. When the expected value of the duty cycle of clock signal CLK has been reached, through iterative stepping of $I_{Pullup}$ and $I_{Pulldown}$, the signal CAL_DONE is generated. An exemplary operation of duty cycle detector 204 is described as follows.

During the precharge mode, the precharge control signal PCH transitions to an active logic high state such that the conductors 403a and 403b and the top plates of capacitors 401a and 401b are precharged to the high power supply rail voltage $V_{ddd}$. Specifically, when precharge control signal PCH transitions to a logic high and is inverted by inverter 406, PMOS precharge transistors 404a and 404b couple conductors 403a and 403b to the high power supply rail $V_{ddd}$. At the same time, a PMOS equalization transistor 405 couples conductors 403a and 403b together to equalize their voltages. The precharge control signal PCH also resets sense amplifiers 402a and 402b and generates the inactive state the sense amp enable signal SA_EN through back to back inverters 407a and 407b which disables sense amplifiers 402a and 402b during precharge.

During the evaluation mode of duty cycle detector 204, the precharge control signal PCH transitions to a logic low state such that equalization transistors 404a–404b and 405 turn-off. Sense amplifiers 402a–402b are enabled by the sense amp enable signal SA_EN. Additionally, when precharge control signal PCH transitions to a logic LOW, transistors 408a and 408b couple conductors 403b and 403a respectively to the noninverting (+) and inverting (−) inputs of sense amplifier 402a and transistors 409a and 409b couple conductors 403a and 403b respectively to noninverting (+) and inverting (−) the inputs of sense amplifier 402b, in preparation for the comparison operations.

In the evaluation mode, the logic high phase of clock signal CLK discharges capacitor $C_0$ 401a to ground through NMOS transistors 410, 411, and 412. Transistor 411 enables the signal path through transistor 410 in response to the logic high state of complementary precharge control signal PCHB. The gate of transistor 412 is biased from a bias voltage BIAS0 across transistor 413. Similarly, capacitor $C_1$ 401b is discharged to ground in response to the low phase of clock signal CLK through inverter 414. In this case, the low phase of clock signal CLK, as inverted by inverter 414, enables NMOS transistor 415. During the operational mode, NMOS transistor 416 enables the path through transistor 415 in response to the complementary precharge control signal PCHB. The current through the signal path to ground is further controled by transistor 417 biased by bias voltage BIAS1 and NMOS transistor 418. Bias voltages BIAS0 and BIAS1 are generated by current switches 222 in response to the control word loaded in register bank 204. By setting these bias voltages, the charges on capacitors 401a and 401b is set. Specifically, for the desired duty cycle bias voltages BIAS0 and BIAS1 will equalize the voltage on capacitors 401a and 401b upon discharge such that sense amplifiers 402a and 402b.

The voltages on capacitors 401a and 401b are compared through conductors 403a and 403b at the inverting (−) and noninverting (+) inputs of sense amplifier 402a. When the voltage on capacitor $C_0$ 401a is larger than the voltage on capacitor $C_1$ 401b, then the flag HIGH transitions to a logic low and the flag LOW to a logic high state. On the other hand, if the voltage on capacitor $C_1$ 401b is larger than the voltage on capacitor $C_0$ 401a, then the flag HIGH transitions to a logic high state and the flag LOW to a logic low state. If the voltages on the capacitors $C_0$ 401a and $C_1$ 401b are approximately equal, sense amplifiers 402a and 402b have a "dead" zone in which both the flags HIGH and LOW both remain in a logic low (inactive) state.

A similar comparison is made by sense amplifier 402b which drives the output circuit which generates the control signal CAL_DONE indicating that the duty cycle of clock signal CLK has reached its expected value and calibration is therefore done. With respects to sense amplifier 402b, however, the voltage on conductor 403a is presented to the non-inverting (+) input and the voltage on conductor 403b is presented to the inverting (−) sense amplifier inputs. Thus, when the output of sense amplifier 402a is in a logic high state as a result of a comparison, the output of sense amplifier 402b is in a logic low state, and vice versa.

The output of sense amplifier 402b and its complement generated by inverter 422 drive a pair of pass gates constructed from PMOS transistors 420a–420b and NMOS transistors 421a–421b. Transistors 420a and 421a pass the output from sense amplifier 402a, as inverted by inverter 419 and transistors 420b and 421b selectively pass the re-inverted output from sense amplifier 402a re-inverted by inverter 423b. The gates of NMOS transistors 421a and PMOS transistor 420b are controlled by the output of sense amplifier 402b, and the gates of PMOS transistor 420a and NMOS transistor 421b by the inverted output of sense amplifier 402b generated by inverter 422. The active high final output CAL_DONE is generated by an inverter 424 when the outputs from both sense amplifier 402a and sense amplifier 402b are approximately equalized at zero volts. Otherwise, CAL_DONE remains in an inactive low state.

Figure 4B:
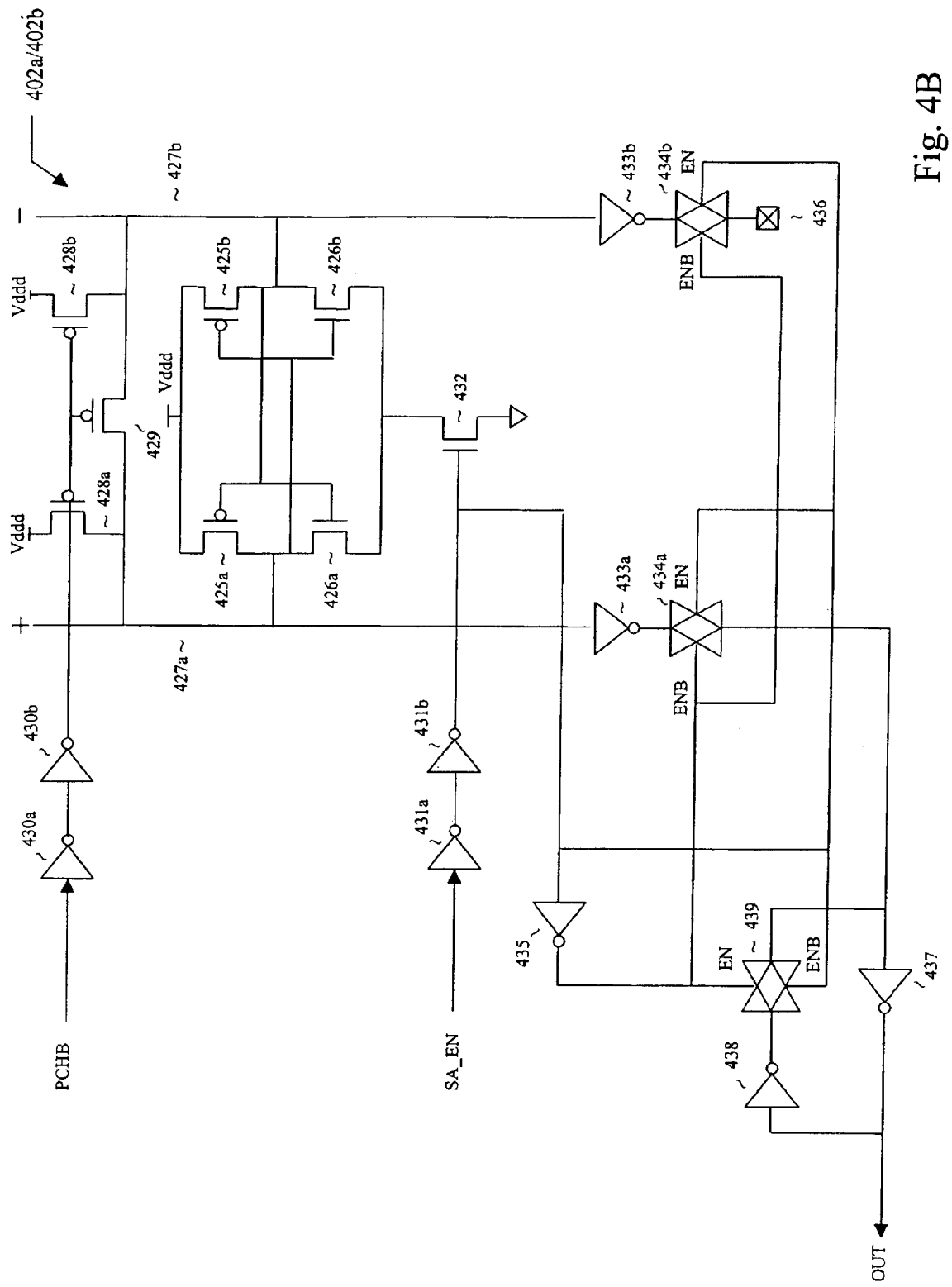
FIG. 4B is an electrical schematic diagram of an exemplary sense amplifier with a dead zone suitable for utilization in the sense amplifiers of the duty cycle detector embodiment of FIG. 4A.

FIG. 4B is an electrical schematic diagram of an exemplary sense amplifier with a dead zone suitable for utilization in sense amplifiers 402a and 402b. In the embodiment of FIG. 4B, each sense amplifier 402a–402b is based on a four-transistor latching cell including a pair of PMOS transistors 425a–425b and a pair of MOS transistors 426a and 426b. Transistors 425a–425b and 426a–426b are crosscoupled, with the gates of transistors 425a and 426a controlled by the voltage on conductor 427b at the output of transistor pair 425b and 426b. Similarly, the gates of transistors 425b and 426b are controlled by the output of transistor pair 425a and 426a and the voltage on conductor 427a. Conductor 427a provides the non-inverting (+) input to sense amplifier 402a/402b and conductor 427b provides the corresponding inverting (−) input. When the voltage on conductor 427a is greater than the voltage on conductor 427b, conductor 427a is pulled up to the high voltage supply rail $V_{ddd}$ and conductor 427b is pulled down to ground. Conversely, when the voltage on conductor 427b is greater than the voltage on 427a, conductor 427b is latched to the high voltage rail $V_{ddd}$ and the voltage on conductor 427a is latched to ground.

Before the comparison is made between the noninverting (+) and inverting (−) inputs to the given sense amplifier 402a/402b, the voltage on conductors 427a and 427b are precharged to the high supply rail $V_{ddd}$ and equalized during the precharge mode. Specifically, when the complementary precharge control signal PCHB transitions to a logic low, PMOS precharge transistors 428a and 428b are turned-on by inverters 430a and 430b and pull both conductors 427a and 427b to the supply rail $V_{ddd}$. At the same time, PMOS equalization transistor 429 turns-on and equalizes the voltage between conductors 427a and 427b. During precharge, the sense amp enable signal SA_EN driven by inverters 431a and 431b maintains transistor 432, which controls the tail current to ground through transistor pairs 425a–426a and 425b–426b, in the off state.

During sensing operations (sense mode), sense amp enable signal SA_EN turns on tail transistor 432 and the precharge control signals PCH and PCHB turn off precharge control transistors 428a –428b and 429. The voltage difference between the non-inverting (+) and inverting (−) inputs is then sensed and latched.

After sensing and latching, the voltages on conductors 427a and 427b are output through inverters 433a and 433b and pass gates 434a and 434b. Pass gates 434a and 434b are enabled by the sense amp enable signal SA_EN and its complement generated by an inverter 435. In the embodiment illustrated in FIG. 4B, the sense amplifier output OUT is generated from the voltage on conductor 427a and the voltage on conductor 427b simply presented to a pad 436. The output signal OUT is driven by an output inverter 437. When the output is not being driven through inverter 433a and pass gate 434a, an inverter 438 and pass gate 439 maintain the sense amplifier output signal OUT in a logic high state.

Correction circuitry 205 is a state machine that responds to the high (HIGH) and low (LOW) signals from duty cycle detector circuit 204 and adjusts pull-up current $I_{Pullup}$ and the pull-down current $I_{Pulldown}$ to variable current buffer 201 accordingly. Specifically, correction circuitry outputs two 6–bit wide words. The first output word P<5:0> steps pull-up current $I_{Pullup}$ with a first current switch matrix in bias current/switching matrix block 206. The second output work N<5:0> steps pull-down current $I_{Pulldown}$ with a second current switch matrix in bias current/switch matrix block 206. (These switch matrices will be discussed further below in conjunction with FIG. 6). Correction circuitry 205 also generates the precharge control signal PCH. An exemplary operation of correction circuitry is as follows:

1. During the precharge (reset) mode, the precharge control signal PCH is generated with an active high logic level to precharge (reset) the circuitry of duty cycle detector 204 as discussed above.
2. During the evaluation mode, the state machine checks for the following conditions and adjusts the values of P<5:0> and N<5:0> as follows:
   (a.) If the output low from duty cycle detector 204 is active and N<5:0> is below its maximum value, NMax, then N<5:0> increments by one (1);
   (b) If the output high from duty cycle detector 204 is active, and P<5:0> is below its maximum value, PMax, then P<5:0> increments by one (1); and
   (c) Otherwise, if the output of detector 204 indicates a match, then calibration is complete and the iteration stops.

Figure 5A:
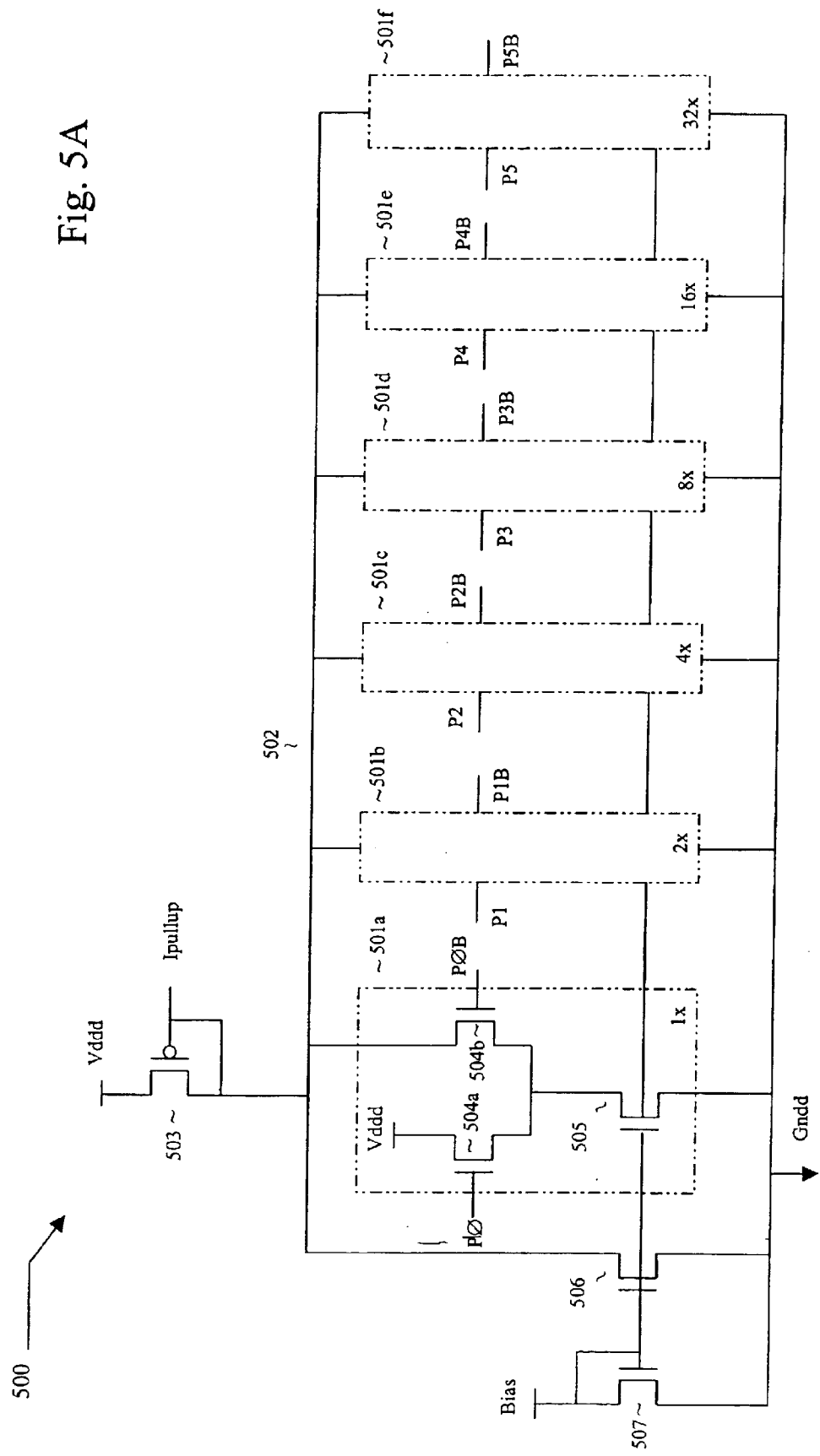
FIG. 5A is an electrical schematic diagram of an exemplary array of binary current sinks suitable for stepping the current to the embodiment of variable current buffer shown in FIG. 2B.

FIG. 5A is an electrical schematic diagram of an exemplary array 500 of binary current sinks 501a–501f suitable for stepping the current to variable current buffer 201. Array 500 is representative of a pair of similar arrays in bias current/switch matrix block 207. The particular array 500 shown in FIG. 5A is used to control the pullup current $I_{Pullup}$ at the summing node 502 as sourced from the high voltage rail $V_{ddd}$ by a load transistor 503 under the control of control word P<5:0>. The unit current value for $I_{Pullup}$ is generated from bias current BIAS_P from the bias current generator of FIG. 5B. A similar array, controlled by the control bits N[5:0] is included in block 207 to step the pulldown current $I_{Pulldown}$.

Each binary weighted current sink 501 in array 500 includes an NMOS transistor 504a controlled by a corresponding bit of control word P[5:0] and a second NMOS transistor 504b controlled by a bit of the complementary word PB[5:0]. The tail current through each pair of transistors 504a and 504b is controlled by one or more NMOS transistors 505. In particular, for current source 501a, which is a one times (1x) current sink, one unit sized tail current control transistor 505 is provided. For binary weighted current sink 501b, which is a two-times (2x) current sink sinking two times the unit current, the tail current out of transistors 504a and 504b is controlled by two parallel unit transistors 505, and so on. In this embodiment, binary weighted current sink 501f, which is a thirty-two-times (32x) current sink sinking thirty-two times the unit current, the tail current is controlled by thirty-two parallel unit transistors 505. The number of binary weighted current sinks 501 and the sizing and number of transistors 505 can vary from embodiment to embodiment depending on the desired current step resolution.

The unit current is set by NMOS transistor 506 which is biased by an NMOS transistor 507 operating from a bias voltage BIAS. The current through unit current transistor 506 is mirrored by the replicated tail current control transistors 505 of the array binary weighted current sources 501.

Binary weighted array 500 generally works as follows. When the control word P[5:0] is set to all logic zeros, and consequently its complement PB[5:0] set to all logic ones, all binary current sinks 501a–501f are on and sinking current. The current available to variable current buffer 201 at summing node 502 is therefore at a minimum. This results in the longest available rise time on the rising edges of intermediate clock ICLK. As bits of control word P[5:0] are incremented and the bits of complementary control word PB[5:0] decremented, the current being sunk through binary weighted current sources 501a–501f is correspondingly reduced by binary weighted steps. This stepping increases the current available at summing node 502 for driving variable current source 201 such that the rising edges of the intermediate clock signal ICLK are pulled up faster thereby shortening the rise time. The operation of the similar array controlling the pulldown current $I_{Pulldown}$ is similar.

Figure 5B:
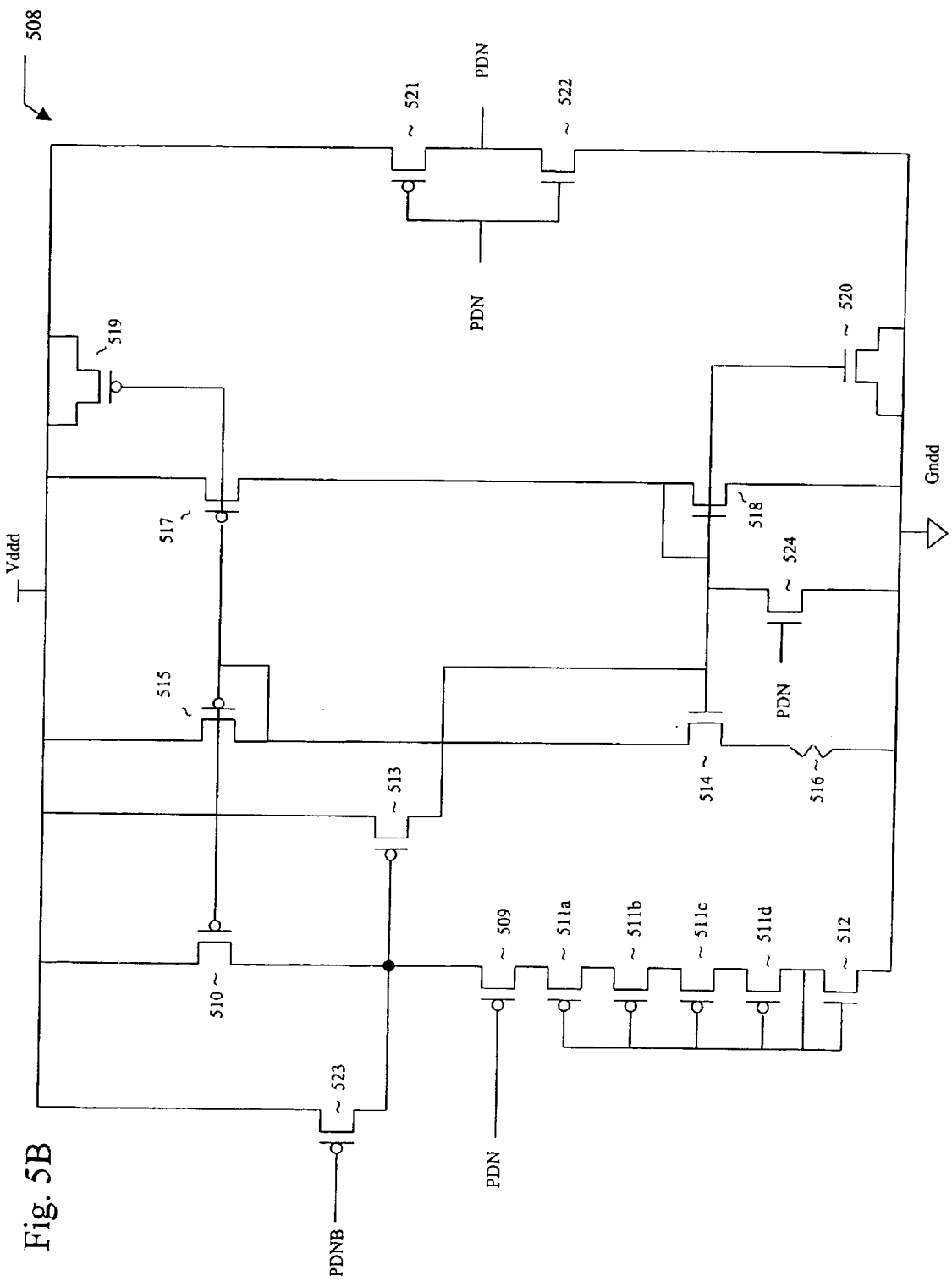
FIG. 5B is an electrical schematic diagram of an exemplary bias current generator suitable for generating the bias currents required by the exemplary binary weighted current switching array of FIG. 5A.

FIG. 5B is an electrical schematic diagram of an exemplary bias current generator 508 suitable for generating the unit bias currents (e.g. $I_{Pullup}$) required by binary weighted current switching array 500, as well as for current switches 222. Exemplary operations of bias current source 508 are generally as follows.

When control signal PDN transitions to a logic low state, PMOS transistor 509 turns on to sink current from the high voltage rail $V_{ddd}$ through PMOS transistor 510. PMOS transistors 509, 510 are loaded by PMOS transistors 511a–511d and diode configured NMOS transistor 512. The gate of PMOS transistor 513 is consequently pulled down such that PMOS transistor 513 turns-on and pulls up the gate of NMOS transistor 514. A current is established through PMOS transistor 515, NMOS transistor 514 and resistor 516. This current is mirrored through PMOS transistor 517 and NMOS transistor 518.

A PMOS transistor 519 provides a capacitance between the gates of PMOS transistors 515 and 517 and the high voltage supply rail $V_{ddd}$. Similarly, at NMOS transistor 520 provides a capacitance between the gates of NMOS transistors 514 and 518. An inverter formed by PMOS transistor 521 and an NMOS transistor 522 generates the complement of control signal PDN, PDMB.

When control signal PDN transitions to a logic high and its complement PDNB transitions to a logic low, transistor 509 turns off the current through low transistors 511a–511b. PMOS transistor 523 pulls up the gate of PMOS transistor 513 such that transistor 513 turns off. At the same time, the logic high level of control signal PDN turns on NMOS transistor 524 which pulls down the gates of NMOS transistor 514 and 518, which in turn turn off.

In sum, the principles of the present invention provide for the register programming of signal duty cycles through variation in the rise and fall times of the edges of an intermediate signal. The rise and fall times are set by a feedback loop which steps the current sources driving a variable current buffer generating the intermediate signal. By changing the rise and fall times of the intermediate signal edges, the trigger point of the following clock driver stage is varied in time thereby varying the generation of the output signal edges.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A signal generator for generating an output signs programmable duty cycle comprising:

a first buffer generating in response to an input signal an intermediate signal having a selected edge with a voltage slope selected to vary a length of a selected one of high and low phases of the output signal, the first buffer comprising a variable current buffer;

current control circuitry selectively controlling a current to the variable current buffer for varying the slope of the selected edge of the intermediate signal, the current control circuitry comprising:

a register for storing a value representing a selected duty cycle of the output signal;

a duty cycle detector for monitoring the output signal duly cycle; and correction circuitry for varying the current to the variable current buffer to compensate for a deviation of the duty cycle monitored by the duty cycle detector from the selected duty cycle; and a second buffer having a selected input voltage threshold for generating the output signal in response to the intermediate signal.

2. The signal generator of claim 1 wherein the selected edge is a rising edge of the intermediate signal.

3. The signal generator of claim 2 wherein the slope of the rising edge is decreased to lengthen a logic high phase of the output signal.

4. The signal generator of claim 1 wherein the selected edge is a falling edge of the intermediate signal.

5. The signal generator of claim 4 wherein the slope of the falling edge is decreased to lengthen a logic low phase of the output signal.

6. A method of generating an output signal with a selectable duty cycle comprising:

varying a drive current with a variable current buffer and current control circuitry controlling a current to the variable current buffer to vary a selected transition time of a selected edge of an intermediate signal, the transition time selected to vary in time generation of a corresponding edge of the output signal, varying the drive current comprising:

selecting an initial drive current;

monitoring a duty cycle of an initial output signal to detect a deviation from an expected duty cycle; and in response to detection of a deviation from the expected duly cycle, stepping the drive current in binary weighted steps from the initial drive current to compensate for the deviation;

generating the intermediate signal from an input signal with the drive current; and generating from the intermediate signal the output signal with a selected one of high and low phases varied by a time interval corresponding to the variation in time of the edge of the output signal.

7. The method of claim 6 wherein varying the drive current comprises decreasing the drive current to lengthen the transition time of the selected edge.

8. The method of claim 6 wherein varying the drive current comprises increasing the drive current to shorten the transition time of the selected edge.

9. The method of claim 6 wherein the selected edge of the intermediate signal is a rising edge and varying a drive current comprises varying a pull-up current for varying the rising edge of the intermediate signal.

10. The method of claim 6 wherein the selected edge of the intermediate signal is a falling edge and varying the drive current comprises varying a pull-down current for varying the falling edge of the intermediate signal.

* * * * *

UNITED STATES PATENT AND TRADEMARK OFFICE
CERTIFICATE OF CORRECTION

PATENT NO. : 6,847,244 B2
DATED : January 25, 2005
INVENTOR(S) : Sanjay Pillay, Khoi Mai, Lou Zheng and Dimitri Pantelakis It is certified that error appears in the above-identified patent and that said Letters Patent is hereby corrected as shown below:

Column 9,
Line 19, delete "signs" and insert -- signal with a --.
Line 32, "duly" should be -- duty --.

Signed and Sealed this

Twenty-sixth Day of April, 2005

JON W. DUDAS
*Director of the United States Patent and Trademark Office*